United States Patent [19]

Freeman

[11] Patent Number: 4,877,753

[45] Date of Patent: Oct. 31, 1989

[54] IN SITU DOPED POLYSILICON USING TERTIARY BUTYL PHOSPHINE

[75] Inventor: Dean W. Freeman, Garland, Tex.

[73] Assignee: Texas Instruments Incorporated, Dallas, Tex.

[21] Appl. No.: 165,457

[22] Filed: Mar. 1, 1988

Related U.S. Application Data

[63] Continuation of Ser. No. 937,956, Dec. 4, 1986, abandoned.

[51] Int. Cl.[4] .......................................... H01L 21/469
[52] U.S. Cl. ......................... 437/101; 148/DIG. 40; 148/DIG. 22; 437/233; 437/959; 437/967; 437/971
[58] Field of Search ................. 437/85, 101, 165, 939, 437/946, 959, 967, 971, 233; 357/2, 59; 148/DIG. 40, 122, 125, 130

[56] References Cited

U.S. PATENT DOCUMENTS 4,708,884 11/1987 Chandross et al. .................. 427/39
4,721,683 1/1988 Ward ..................................... 437/18

FOREIGN PATENT DOCUMENTS 0014526 2/1980 Japan .
0065546 4/1981 Japan .

Primary Examiner—Brian E. Hearn
Assistant Examiner—William Bunch
Attorney, Agent, or Firm—Rodney M. Anderson; Melvin Sharp

[57] ABSTRACT

The disclosure relates to a method of forming in situ phosphorous doped polysilicon wherein a surface upon which phosphorous doped polysilicon is to be deposited is placed in a vacuum furnace and, after low pressure HCl cleaning of the surface and furnace, a predetermined ratio of silane and a gaseous phosphorous containing compound taken from the class consisting of phosphorous trichloride, tertiary butyl phosphine, isobutyl phosphine, trimethyl phosphate and tetramethyl phosphate are simultaneously passed through the furnace at predetermined pressure and temperature to provide a uniformly phosphorous doped layer of polysilicon on the surface.

16 Claims, 1 Drawing Sheet

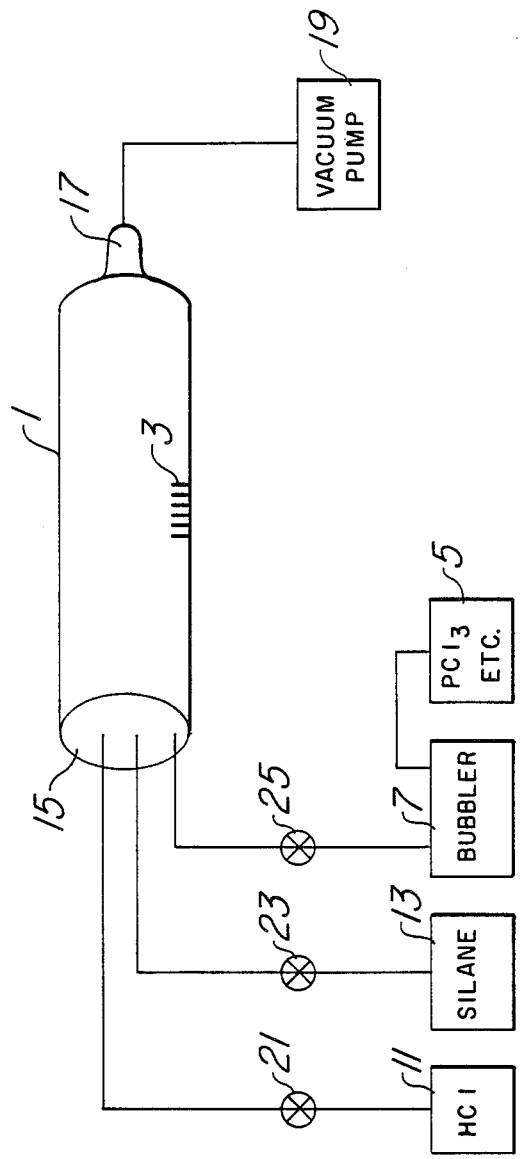

IN SITU DOPED POLYSILICON USING TERTIARY BUTYL PHOSPHINE

This application is a continuation of application Ser. No. 937,956, filed 12/04/86 now abandoned.

BACKGROUND OF THE INVENTION

1. Field of the invention

This invention relates to in situ doping of polycrystalline silicon with phosphorous trichloride, tertiary butyl phosphine, isobutyl phosphine, trimethyl phosphate and tetramethyl phosphate.

2. Brief description of the prior art

In situ doping of polycrystalline silicon (polysilicon) is known in the art, such doping generally using phosphine as the phosphorous containing dopant and diborane as the boron containing dopant. However, special techniques are required when phosphine is the dopant to improve sheet resistance and thickness uniformity and to achieve an acceptable deposition rate. Also, the prior art phosphorous-containing dopants are highly toxic and therefore require a great deal of care in handling. This prior art is set forth in an article by B. S. Meyerson and M. L. Yu, ECS Extended Abstracts 83-1. 651(1983), an article by D. L. Flowers in the same publication 84-1. 256(1984) and an article of H. Kurokawa, Journal of the Electrochemical Society, 129.26.20(1982).

In situ doping of polysilicon is attractive because the dopant distribution is uniform throughout the film if the dopant is incorporated during and along with the deposition of the polysilicon. This dopant uniformity is extremely advantageous in the refilling of trenches with polysilicon since doping concentrations will then be the same throughout the entire trench, thereby eliminating the need for complicated implants and anneals currently used to fill trenches.

In situ doping differs from other prior art doping methods, such as ion implantation and solid solid source diffusion in a furnace tube, wherein the dopant is put down interstitially with the polysilicon and simultaneously therewith. This provides the uniform build-up of the polysilicon film with the dopant uniformly distributed therein. However, as stated above, the dopants utilized in the prior art have been extremely toxic and have led to the requirement that measures be taken to protect against the fumes and other effluent thereof, this requiring a great deal of expense. It is therefore a need of the art to provide a dopant for use in the in situ doping process which does not have the toxic effect of prior art dopants, yet can provide the same results.

SUMMARY OF THE INVENTION

Chlorine-containing dopants have not been used in the past, probably because it was believed that chlorine inclusion in the polysilicon films produced might result whereas the hydride reaction of the prior art would not cause this problem.

It has been determined that phosphorous trichloride as well as the non-chlorine containing phosphorous compounds tertiary butyl phosphine, isobutyl phosphine, trimethyl phosphate and tetramethyl phosphate, when used as dopants do not display the toxicity of the prior art dopants as noted hereinabove, yet, in practice, have been found to operate satisfactorily and, in the case of phosphorous trichloride, not to provide the expected chlorine contamination. These materials also display improved sheet resistance and thickness uniformity relative to phosphine. The chlorine, when present, has been found to be removable with relative ease in actual practice and not to remain in the doped polysilicon layer formed when using phosphorous trichloride as the phosphorous dopant source.

In accordance with the present invention, a low pressure chemical vapor deposition (LPCVD) furnace in the form of a tube, operated horizontally is provided, though any deposition apparatus can be utilized using low pressure. The furnace is evacuated to an ultimate pressure of 10 to 20 milliTorr., the temperature therein is allowed to stabilize in the range of about 550 to 700 degrees C. and the furnace, as well as any wafers therein upon which deposition is to take place, are precleaned using HCl. One of the above noted gaseous phosphorous containing compositions is introduced via a bubbler into the LPCVD furnace through the door at the inlet thereof and silane is also introduced into the LPCVD furnace simultaneously therewith in the same manner, the phosphorous containing composition being introduced at a flow rate between 1 and 10 sccm and the silane being introduced at a flow rate between 50 and 100 sccm. The preferred pressure in the furnace is 100 to 1000 milliTorr. The preferred temperature in the central region of the furnace is 600 to 640 degrees C. The resulting polysilican layer was found to be uniformly doped with phosphorous and contained no significant chlorine impurity when phosphorous trichloride was used as the dopant.

BRIEF DESCRIPTION OF THE DRAWINGS

The FIGURE is a schematic diagram of a system for providing phosphorous trichloride and other phosphorous containing compound in situ doping of polysilicon.

DESCRIPTION OF THE PREFERRED EMBODIMENTS

Briefly, in accordance with the present invention, doped polysilicon is formed using phosphorous trichloride, tertiary butyl phosphine, isobutyl phosphine, trimethyl phosphate and/or tetramethyl phosphate as the dopant and silane as the silicon source.

Referring to the FIGURE, there is shown a system for forming an in situ polysilicon layer on a wafer, substrate or the like using a phosphorous trichloride dopant. The system includes an LPCVD furnace 1 having an inlet 15 and an outlet 17 with a vacuum pump 19 thereat to maintain the desired vacuum within the furnace. Wafers 3, upon which deposition is to take place, are disposed within the furnace. The system includes a container of phosphorous trichloride 5 or other phosphorous containing compound as noted above with a bubbler 7 through which the phosphorous trichloride passes on its path from the container 5 to the furnace inlet 15 via the valve 25. A container containing gaseous HCl 11 with valve 21 and a container containing silane 13 with valve 23 are connected to the inlet 15 of furnace 1.

In operation, the furnace 1 was heated to a temperature of 620 degrees C. at the center region thereof, with the inlet being about 610 degrees C. and the outlet being about 600 degrees C. until the temperature therein stabilized. The pressure in the furnace was then dropped to 10 to 20 milliTorr under control of the vacuum pump 19 and the furnace with wafers or substrates therein was then cleansed with HCl gas from the container 11 by opening valve 21. The HCl source was then cut off by closing valve 21 and the phosphorous trichloride container 5 and silane container 13 were opened by opening valves 23 and 25 to provide a flow rate for the phosphorous trichloride of about 5 sccm and a flow rate for the silane of about 75 sccm simultaneously, the pressure in the furnace being held at about 150 to 400 milliTorr. The phosphorous trichloride broke down to phosphorous and chlorine with the chlorine going off and the phosphorous being deposited along with the silicon from the silane to provide a buildup of phosphorous doped polysilicon on the wafers or substrates 3 in the furnace. The deposition time determines the amount of build up for a given flow rate, temperature and pressure. The valves 23 and 25 were then closed, the furnace was returned to ambient temperature and pressure and the processed wafers or substrates were removed.

Using the parameters above described, resistivities of less that 4000 microohm-centimeters are obtainable with good consistency.

The above described example was repeated using the identical parameters and materials except for the substitution of tertiary butyl phosphine for the phosphorous trichloride. The results were substantially the same as obtained for the phosphorous trichloride.

Though the invention has been described with respect to a preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of forming a layer of phosphorous doped polysilicon, comprising the steps of:
   (a) providing a furnace having a surface therein for deposition of phosphorous doped polysilicon thereon,
   (b) evacuating said furnace to a pressure in the range of from about 100 to about 1000 milliTorr.,
   (c) heating said furnace to a temperature of from about 610 to about 700 degrees C., and
   (d) simultaneously entering a predetermined ratio of silane and gaseous tertiary butyl phosphine into said furnace to form a layer of uniformly phosphorous doped polysilicon on said surface.

2. The method of claim 1 wherein said furnace and said surface are cleaned in an HCl atmosphere at a pressure of from about 10 to about 20 milliTorr. prior to step (b).

3. The method of claim 1 wherein the flow rate of said tertiary butyl phosphine is from about 1 to about 10 sccm and the flow rate of said silane is from about 50 to about 100 sccm.

4. The method of claim 2 wherein the flow rate of said tertiary butyl phosphine is from about 1 to about 10 sccm and the flow rate of said silane is from about 50 to about 100 sccm.

5. The method of claim 1 wherein said surface is disposed in said furnace substantially normal to the direction of atmosphere flow therein.

6. The method of claim 2 wherein said surface is disposed in said furnace substantially normal to the direction of atmosphere flow therein.

7. The method of claim 3 wherein said surface is disposed in said furnace substantially normal to the direction of atmosphere flow therein.

8. The method of claim 4 wherein said surface is disposed in said furnace substantially normal to the direction of atmosphere flow therein.

9. The method of claim 1 wherein said tertiary butyl phosphine is passed through a bubbler prior to entry into said furnace.

10. The method of claim 2 wherein said tertiary butyl phosphine is passed through a bubbler prior to entry into said furnace.

11. The method of claim 3 wherein said tertiary butyl phosphine is passed through a bubbler prior to entry into said furnace.

12. The method of claim 4 wherein said tertiary butyl phosphine is passed through a bubbler prior to entry into said furnace.

13. The method of claim 5 wherein said tertiary butyl phosphine is passed through a bubbler prior to entry into said furnace.

14. The method of claim 6 wherein said tertiary butyl phosphine is passed through a bubbler prior to entry into said furnace.

15. The method of claim 7 wherein said tertiary butyl phosphine is passed through a bubbler prior to entry into said furnace.

16. The method of claim 8 wherein said tertiary butyl phosphine is passed through a bubbler prior to entry into said furnace.

* * * * *